US011222769B2

(12) United States Patent
Liang et al.

(10) Patent No.: US 11,222,769 B2
(45) Date of Patent: *Jan. 11, 2022

(54) MONOPOLE ANTENNA ARRAY SOURCE WITH GAS SUPPLY OR GRID FILTER FOR SEMICONDUCTOR PROCESS EQUIPMENT

(71) Applicant: Applied Materials, Inc., Santa Clara, CA (US)

(72) Inventors: Qiwei Liang, Fremont, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 406 days.

This patent is subject to a terminal disclaimer.

(21) Appl. No.: 15/858,886

(22) Filed: Dec. 29, 2017

(65) Prior Publication Data

US 2018/0342374 A1 Nov. 29, 2018

Related U.S. Application Data

(60) Provisional application No. 62/511,885, filed on May 26, 2017.

(51) Int. Cl.
*H01J 37/32* (2006.01)
*H05H 1/46* (2006.01)
(Continued)

(52) U.S. Cl.
CPC .......... *H01J 37/3211* (2013.01); *C23C 16/26* (2013.01); *C23C 16/45565* (2013.01);
(Continued)

(58) Field of Classification Search
USPC .................................................... 156/345.47
See application file for complete search history.

(56) References Cited

U.S. PATENT DOCUMENTS 4,335,289 A   6/1982   Smith
4,546,225 A   10/1985  McCammon
(Continued)

FOREIGN PATENT DOCUMENTS

JP      2010789731      9/2010
KR      10-2007-0112988 11/2007
(Continued)

OTHER PUBLICATIONS

International Search Report and Written Opinion in International Application No. PCT/US2018/034675, dated Sep. 17, 2018, 17 pages.

(Continued)

*Primary Examiner* — Ram N Kackar
(74) *Attorney, Agent, or Firm* — Fish & Richardson P.C.

(57) ABSTRACT

A plasma reactor includes a chamber body having an interior space that provides a plasma chamber, a gas distribution port to deliver a processing gas to the plasma chamber, a workpiece support to hold a workpiece, an antenna array comprising a plurality of monopole antennas extending partially into the plasma chamber, and an AC power source to supply a first AC power to the plurality of monopole antennas. The plurality of monopole antennas can extend through a first gas distribution plate. A grid filter can be positioned between the workpiece support and the plurality of monopole antennas.

11 Claims, 9 Drawing Sheets

(51) Int. Cl.
*H01L 21/3065* (2006.01)
*C23C 16/503* (2006.01)
*C23C 16/26* (2006.01)
*C23C 16/455* (2006.01)
*C23C 16/50* (2006.01)
*H01L 21/02* (2006.01)
*H01L 21/67* (2006.01)

(52) U.S. Cl.
CPC ............ *C23C 16/50* (2013.01); *C23C 16/503* (2013.01); *H01J 37/3222* (2013.01); *H01J 37/3244* (2013.01); *H01J 37/32449* (2013.01); *H01J 37/32458* (2013.01); *H01J 37/32715* (2013.01); *H01J 37/32724* (2013.01); *H01L 21/02274* (2013.01); *H01L 21/3065* (2013.01); *H05H 1/46* (2013.01); *H01J 2237/334* (2013.01); *H01J 2237/3321* (2013.01); *H01J 2237/3341* (2013.01); *H01L 21/02115* (2013.01); *H01L 21/67017* (2013.01); *H01L 21/67103* (2013.01); *H05H 1/463* (2021.05); *H05H 1/466* (2021.05); *H05H 1/4652* (2021.05)

(56) References Cited

U.S. PATENT DOCUMENTS

| | | |
|---|---|---|
| 4,613,836 A | 9/1986 | Evans |
| 5,235,251 A | 8/1993 | Schlie |
| 5,534,109 A | 7/1996 | Fujiwara et al. |
| 5,844,195 A | 12/1998 | Fairbairn |
| 6,110,556 A | 8/2000 | Bang |
| 6,376,817 B1 | 4/2002 | McFadden |
| 6,551,445 B1 | 4/2003 | Yokogawa et al. |
| 6,688,375 B1 | 2/2004 | Turner et al. |
| 6,736,930 B1 | 5/2004 | Hongoh |
| 7,137,354 B2 | 11/2006 | Collins |
| 7,695,567 B2 | 4/2010 | Fu |
| 7,967,996 B2 | 6/2011 | Collins et al. |
| 8,636,871 B2 * | 1/2014 | Sawada ............ H01J 37/32082 156/345.47 |
| 8,642,135 B2 | 2/2014 | Qin et al. |
| 8,796,131 B2 | 8/2014 | Jones et al. |
| 8,962,224 B2 | 2/2015 | Wu et al. |
| 10,039,157 B2 | 7/2018 | Stowell et al. |
| 2002/0046807 A1 | 4/2002 | Hongo |
| 2002/0073922 A1 | 6/2002 | Frankel |
| 2002/0110998 A1 | 8/2002 | Ko |
| 2002/0164883 A1 | 11/2002 | Ohmi |
| 2003/0168012 A1 | 9/2003 | Tamura et al. |
| 2004/0050494 A1 | 3/2004 | Ohmi |
| 2004/0166612 A1 | 8/2004 | Maydan et al. |
| 2005/0173422 A1 | 8/2005 | Kato et al. |
| 2006/0137613 A1 | 6/2006 | Kasai |
| 2007/0133919 A1 | 6/2007 | Ohmi et al. |
| 2008/0106470 A1 | 5/2008 | Hu et al. |
| 2009/0035945 A1 * | 2/2009 | Fujii .................. C23C 16/4405 438/758 |
| 2009/0159214 A1 * | 6/2009 | Kasai ............... H01J 37/32192 156/345.41 |
| 2010/0218722 A1 | 9/2010 | Vikharev |
| 2010/0240225 A1 | 9/2010 | Sato |
| 2011/0008550 A1 | 1/2011 | Murata et al. |
| 2011/0174778 A1 * | 7/2011 | Sawada ............ H01J 37/32091 216/68 |
| 2011/0293854 A1 * | 12/2011 | Takizawa ......... H01J 37/32935 427/569 |
| 2012/0098405 A1 | 4/2012 | Chen |
| 2012/0129358 A1 | 5/2012 | Ogawa et al. |
| 2012/0222816 A1 | 9/2012 | Ikeda et al. |
| 2013/0284093 A1 | 10/2013 | Jang |
| 2014/0158302 A1 | 6/2014 | Ikeda et al. |
| 2014/0217895 A1 | 8/2014 | Busche |
| 2014/0227881 A1 * | 8/2014 | Lubomirsky ..... C23C 16/45565 438/710 |
| 2015/0279626 A1 | 10/2015 | Chen |
| 2015/0348757 A1 | 12/2015 | Stowell et al. |
| 2015/0351166 A1 | 12/2015 | Stowell et al. |
| 2016/0276134 A1 | 9/2016 | Collins et al. |
| 2016/0284519 A1 | 9/2016 | Kobayashi et al. |
| 2017/0092470 A1 | 3/2017 | Ramaswamy et al. |
| 2018/0342372 A1 | 11/2018 | Liang et al. |
| 2018/0342373 A1 | 11/2018 | Liang et al. |

FOREIGN PATENT DOCUMENTS

| | | |
|---|---|---|
| KR | 10-2011-0088471 | 9/2011 |
| KR | 10-2013-017994 | 10/2013 |
| KR | 101299702 | 10/2013 |

OTHER PUBLICATIONS

U.S. Appl. No. 14/293,123, filed Jun. 2, 2014, Stowell et al.

* cited by examiner ately
MONOPOLE ANTENNA ARRAY SOURCE WITH GAS SUPPLY OR GRID FILTER FOR SEMICONDUCTOR PROCESS EQUIPMENT

CROSS-REFERENCE TO RELATED APPLICATIONS

This application claims priority to U.S. application Ser. No. 62/511,885, filed on May 26, 2017, the entire disclosure of which is incorporated by reference.

TECHNICAL FIELD

This specification relates to wafer processing systems and related methods.

BACKGROUND

Processing of a workpiece such as a semiconductor wafer can be carried out using a form of electromagnetic energy, such as RF power or microwave power, for example. The power may be employed, for example, to generate a plasma, for carrying out a plasma-based process such as plasma enhanced chemical vapor deposition (PECVD) or plasma enhanced reactive ion etching (PERIE). Some processes need extremely high plasma ion densities with extremely low plasma ion energies. This is true for processes such as deposition of diamond-like carbon (DLC) films, where the time required to deposit some type of DLC films can be on the order of hours, depending upon the desired thickness and upon the plasma ion density. A higher plasma density requires higher source power and generally translates to a shorter deposition time.

A microwave source typically produces a very high plasma ion density while producing a plasma ion energy that is less than that of other sources (e.g., an inductively coupled RF plasma source or a capacitively coupled RF plasma source). For this reason, a microwave source would be ideal. However, a microwave source cannot meet the stringent uniformity required for distribution across the workpiece of deposition rate or etch rate. The minimum uniformity may correspond to a process rate variation across a 300 mm diameter workpiece of less than 1%.

SUMMARY

In one aspect, a plasma reactor includes a chamber body having an interior space that provides a plasma chamber, a gas distribution port to deliver a processing gas to the plasma chamber, a workpiece support to hold a workpiece, an antenna array comprising a plurality of monopole antennas extending partially into the plasma chamber, and an AC power source to supply a first AC power to the plurality of monopole antennas.

Implementations may include one or more of the following features.

The workpiece support may be configured to hold the workpiece such that a front surface of the workpiece faces the antenna array. The plurality of monopole antennas may extend in parallel into the plasma chamber. A portion of each monopole antenna that extends into the plasma chamber may be cylindrical. A portion of each monopole antenna that extends into the plasma chamber may be conical. The plurality of monopole antennas may extend through a plate portion of the chamber body. The plate portion may provide a ceiling of the plasma chamber. Each monopole antenna may include an outwardly extending flange positioned on a far side of the plate portion from the plasma chamber. The plate portion may be conductive. Each sheath of a plurality of insulative sheaths may surround a portion of a monopole antenna that extends through the plate portion to insulate the monopole antenna from the plate portion. Each monopole antenna may have an outwardly extending flange positioned on a far side of the plate portion from the plasma chamber, and each insulative sheath may have an outwardly extending flange separating the flange of the monopole antenna from the plate portion.

The workpiece support may be configured to hold the workpiece such that a front surface of the workpiece is perpendicular to a long axis of the plurality of monopole antennas. The workpiece support may be configured to hold the workpiece such that a front surface of the workpiece faces the antenna array. The plurality of monopole antennas face the workpiece support without an intervening barrier.

There may be plurality of microwave or RF transparent window sheaths, and each window sheath may surround a portion of a monopole antenna that projects into the plasma chamber. The plurality of window sheath comprise a material selected from ceramic and quartz.

The monopole antennas may be spaced uniformly across the plate portion. The monopole antennas may have a uniform size and shape. The monopole antennas may have non-uniform size or shape. The plurality of monopole antennas may be arranged in a hexagonal pattern.

A first gas distribution plate may have a first plurality of gas injection orifices, a first process gas plenum overlying first gas distribution plate and a first process gas supply conduit coupled to the first process gas plenum. The plurality of monopole antennas may extend through the gas distribution plate. The plurality of gas injection orifices may be positioned in spaces between the monopole antennas.

A second gas distribution plate may have a second plurality of gas injection orifices that couple to a third plurality of gas injection orifices in the first gas distribution plate, a second process gas plenum overlying the second gas distribution plate, and a second process gas supply conduit coupled to the second process gas plenum. The plurality of monopole antennas may extend through the first gas distribution plate and the second gas distribution plate.

The AC power source may be configured to apply microwave power to the plurality of monopole antennas. The AC power source is configured to apply microwave power to the plurality of monopole antennas so as to generate plasma in the plasma chamber. The AC power supply may include a plurality of auto-tuners, each auto-tuner coupled to a different monopole antenna.

The AC power source may be configured to generate AC power on a plurality of power supply lines at a plurality of different phases, the plurality of monopole antennas may be divided into a plurality of groups, and different groups of monopole antennas may be coupled to different power supply lines. The number of different power supply lines may be at least 4. Each group of monopole antennas may be defined by a spatially continuous zone of adjacent monopole antennas. Monopole antennas in spatially adjacent zones may be coupled to power supply lines that provide AC power at sequentially adjacent phases. The plurality of monopole antennas may be divided into N groups and the AC power source is configured to generate AC power on N power supply lines phases separated by 360/N. N may be 4 or 6 or 8. The spatially continuous zones may be a plurality of linear rows. The spatially continuous zones may be a plurality of circular sectors.

In another aspect, a method of plasma processing a workpiece includes supporting a workpiece in a plasma chamber, delivering a processing gas to the plasma chamber, and generating a plasma in the chamber by applying AC power to an antenna array that comprises a plurality of monopole antennas extending partially into the plasma chamber.

In another aspect, a plasma reactor includes a chamber body having an interior space that provides a plasma chamber, a process gas distribution system to deliver a processing gas to the plasma chamber, a workpiece support to hold a workpiece, and an antenna array comprising a plurality of monopole antennas. The process gas distribution system includes a first gas distribution plate having a first plurality of gas injection orifices, a first process gas plenum overlying gas distribution plate, and a first process gas supply conduit coupled to the first process gas plenum. The plurality of monopole antennas extend through the first gas distribution plate and partially into the plasma chamber.

Implementations may include one or more of the following features.

The plurality of gas injection orifices may be positioned in portions of the first gas distribution plate that separate the monopole antennas. The process gas distribution system may include a gas plenum plate having a recess on a surface thereof that face the first gas distribution plate, the recess providing the plenum. The plurality of monopole antennas may extend through the gas plenum plate. The plurality of monopole antennas may extend through non-recessed regions of the gas plenum plate between the recesses. Each monopole antenna may be surrounded by a respective portion of the recess.

A second gas distribution plate may have a plurality of passages that couple to a second plurality of gas injection orifices in the first gas distribution plate. A second process gas plenum overlying may overlie the second gas distribution plate, and a second process gas supply conduit may be coupled to the second process gas plenum. The plurality of monopole antennas may extend through the first gas distribution plate and the second gas distribution plate.

The plurality of monopole antennas may be arranged in a hexagonal pattern. The plurality of gas injection orifices may be arranged in a hexagonal pattern. The plurality of monopole antennas may extend in parallel into the plasma chamber. An AC power source may be configured to apply microwave or RF power to the plurality of monopole antennas so as to generate plasma in the plasma chamber.

In another aspect, a plasma reactor includes a chamber body having an interior space that provides a plasma chamber, a grid filter extending across the interior space and diving the plasma chamber into an upper chamber and a lower chamber, a gas distribution port to deliver a processing gas to the upper chamber, a workpiece support to hold a workpiece in the lower chamber, an antenna array comprising a plurality of monopole antennas extending partially into the upper chamber, and an AC power source to supply a first AC power to the plurality of monopole antennas.

Implementations may include one or more of the following features.

The plurality of monopole antennas may extend in parallel into the upper chamber. The plurality of monopole antennas may extend perpendicular to the grid filter. The workpiece support may be configured to hold the workpiece parallel to the grid filter. The grid filter may be positioned between the plurality of monopole antennas and the workpiece support. The AC power source is configured to apply microwave power to the plurality of monopole antennas so as to generate plasma in the upper chamber.

A second process gas distribution system may deliver a second processing gas to the lower chamber. The grid filter may include a gas distribution plate having a first plurality of gas injection orifices and a gas plenum plate overlying the gas distribution plate. A recess in a bottom surface of the gas plenum plate may provide a plenum for the second processing gas to flow to the gas injection orifices. The grid filter may have a plurality of apertures through the gas plenum plate and the gas distribution plate for flow of plasma or electrons from the upper chamber to the lower chamber.

In another aspect, a plasma reactor includes a chamber body having an interior space that provides a plasma chamber, a gas distribution port to deliver a processing gas to the plasma chamber, a workpiece support to hold a workpiece, an antenna array comprising a plurality of monopole antennas extending partially into the plasma chamber, and an AC power source to supply a first AC power to the plurality of monopole antennas. The plurality of monopole antennas are divided into a plurality of groups of monopole antennas, and the AC power source is configured to generate AC power on a plurality of power supply lines at a plurality of different phases, and different groups of monopole antennas are coupled to different power supply lines.

Implementations may include one or more of the following features.

Each group of monopole antennas may be defined by a spatially continuous zone of adjacent monopole antennas. The monopole antennas in spatially adjacent zones are coupled to power supply lines that provide AC power at sequentially adjacent phases. The spatially continuous zones may be a plurality of linear rows. The spatially continuous zones may be a plurality of sectors arranged angularly around a central axis.

The plurality of monopole antennas may be divided into N groups and the AC power source is configured to generate AC power on N power supply lines at phases separated by 360/N. The groups may form a plurality of linear rows, and the linear rows may have equal width. The groups may form a plurality of sectors arranged angularly around a central axis, and the plurality of sectors may subtend equal angles around the central axis. The plurality of sectors may be circular sectors or triangular sectors.

The AC power source may be configured to apply a common phase shift to the phases on the N power supply lines. The AC power source may be configured to increase the phase shift linearly over time. The AC power source may be configured such that a phase on a respective power supply line has a phase shift frequency between 1-1000 Hz.

The AC power source is configured to apply microwave or RF power to the plurality of monopole antennas so as to generate plasma in the plasma chamber. The AC power supply comprises a plurality of auto-tuners, each auto-tuner coupled to a different monopole antenna. The reactor may include a supplemental monopole antenna. The supplemental monopole antenna may be positioned at a center of the array. The center monopole antenna may be driven with a one-phased signal.

In another aspect, a method of plasma processing a workpiece includes supporting a workpiece in a plasma chamber, delivering a processing gas to the plasma chamber, and generating a plasma in the chamber by generating AC power on a plurality of power supply lines at a plurality of different phases, and applying the AC power at the plurality of different phases from the power supply lines to respective different groups of monopole antennas that extend partially into the plasma chamber.

Advantages of the foregoing may include, but are not limited to, those described below and herein elsewhere. A plasma reactor in accordance to certain aspects can provide improved process uniformity, e.g., improved uniformity of deposition or etching of a layer of material onto a substrate. The plasma reactor can use ions or radicles for processes more effectively, thus can provide improved process speed, e.g., deposition rate or etching rate, and thus increasing throughput. The plasma reactor can have better temperature control thus provide a more stable process.

The details of one or more implementations of the subject matter described in this specification are set forth in the accompanying drawings and the description below. Other potential features, aspects, and advantages will become apparent from the description, the drawings, and the claims.

DETAILED DESCRIPTION

Figure 1:
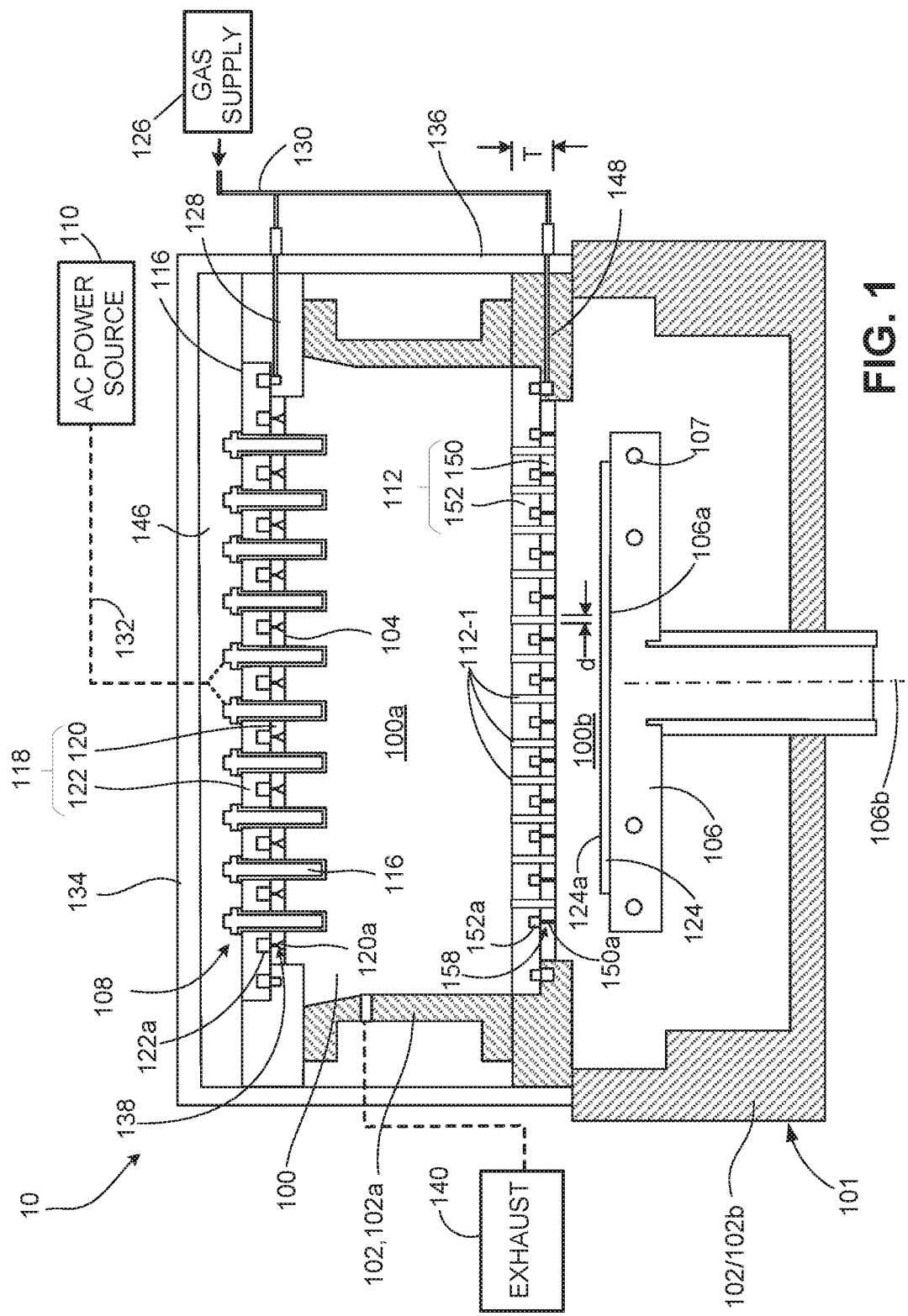
FIG. 1 is a schematic cross-sectional side view of a plasma reactor in accordance with a first embodiment.

Processing of a workpiece, such as a semiconductor wafer, can be carried out in a plasma reactor. Electromagnetic energy, such as RF power or microwave (MW) power, can be employed, for example, to generate a plasma in a chamber to carry out a plasma-based process, e.g., plasma enhanced chemical vapor deposition (PECVD) or plasma enhanced reactive ion etching (PERIE). Some processes, e.g., the deposition of diamond-like carbon (DLC) films, need high plasma ion densities with low plasma ion energies. A higher plasma density requires a higher source power and generally results in a shorter deposition time.

An advantage of a microwave source is that such a source can produce a very high plasma ion density while producing a plasma ion energy that is less than that of other sources (e.g., an inductively coupled RF plasma source or a capacitively coupled RF plasma source). Another advantage of a microwave plasma source is the capability to generate plasma in a wide range of chamber pressures, generally from above atmospheric pressure down to $10^{-6}$ Torr or below. This enables microwave plasma processing to be used across a very wide range of processing applications.

However, many microwave sources cannot meet the stringent uniformity requirements of semiconductor processing. The minimum uniformity may correspond to a process rate variation across a 300 mm diameter workpiece of less than 1%. In systems in which microwaves propagate into the chamber through slots in a waveguide, the antenna can have a periodic power deposition pattern reflecting the wave pattern of the microwave emission and the slot layout, which rendering the process rate distribution non-uniform. This prevents attainment of the desired process rate uniformity across the workpiece. One technique to reducing the uniformity problem is to use a rotary antenna in the plasma chamber. Unfortunately, this technique can have various setbacks, such as microwave leakage through the timing belt slots of antenna rotation, and microwave auto-tuning difficulty due to the antenna rotation. In addition, gas distribution from the center to edge of a substrate might not be uniform.

However, the microwave power can be delivered into the chamber through a monopole antenna array. Microwaves propagate into the chamber through the antennas. This can mitigate the problem of slots in an antenna generating a periodic power deposition pattern. In addition, significant improvements in uniformity can result from, for example, applying power to groups of antennas at different phases, thus mimicking a rotary source.

Another limitation to the processing rate is the amount of microwave power that can be delivered to a process chamber without damaging or overheating the gas plate or the grid filter. A conventional gas plate provides a vacuum boundary of the chamber and consequently can be subject to significant mechanical stress, rendering the gas plate vulnerable to damage from overheating. Such a gas plate can withstand only low microwave power levels. As a result, some processes, e.g., DLC deposition processes, can require hours to reach a desired DLC film thickness. This problem can be addressed by providing a window sheath surrounding each monopole antenna that projects into the plasma chamber, the danger of mechanical stress is reduced and the power that can be applied can be increased.

Referring to FIG. 1, a plasma reactor 10 includes a chamber body 101 that has a side wall 102, e.g., of cylindrical shape, to enclose a chamber 100. The sidewall 102 is formed of a material that is opaque to microwaves in order to confine microwaves within the chamber. The sidewalls can be a conductive material, e.g., a metal.

The chamber 100 can be divided by a grid filter 112 into an upper chamber 100a and a lower chamber 100b. The lower chamber 100b is a drift space because of a lack of substantial electric field therein in the absence of an applied bias voltage. The sidewall 102 can include an upper sidewall 102a that surrounds the upper chamber 100a and a lower sidewall 102b that surrounds the lower chamber 100b.

A ceiling 104, that can be formed of a conductive material, overlies the upper chamber 100a. The ceiling 104 can be provided by a showerhead 118.

The reactor 10 further includes an array 108 of monopole antennas 116 connected to a AC power source 110 that is configured to generate power at a microwave or RF frequency. The monopole antenna array 108 includes a plurality of monopole antennas 116 that extend partially into the upper chamber 100a. The antennas 116 are formed of a conductive material, e.g., copper or aluminum, or another metal coated with high conductive layer. In some implementations, the antennas 116 project in parallel into the upper chamber 100a. The antennas 116 can project through the ceiling 104 of the chamber body 101. A bottom surface of each antenna 116 can face the grid filter 112.

In some implementations, the bottom surfaces of the antennas 116 are coplanar, e.g., the antennas 116 project by the same amount into the chamber 100. Alternatively, the bottom surfaces of some antennas 116, e.g., antennas in the center of the array 108, can be recessed relative to other antennas. In this case, the antennas 116 at the edge of the array 108 project further into the chamber 100 than the antennas 116 at the center of the array 108.

The antenna array 108 can be split into groups of antennas, e.g., groups with equal amount of antennas. This permits different power to be provided at different phases to different groups of antennas 116 within the antenna array 108.

Figure 5:
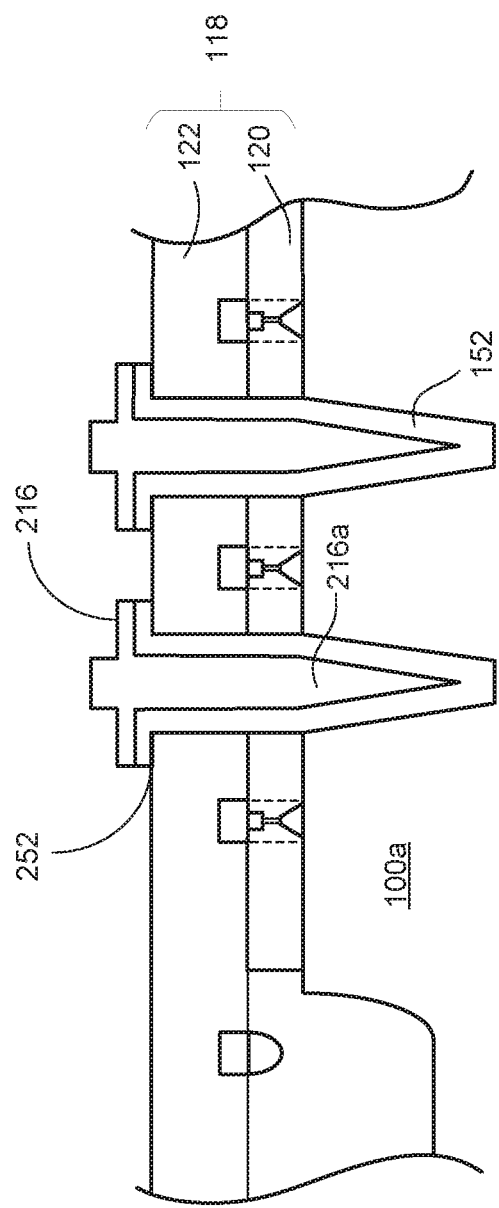
FIG. 5 is an example of a different embodiment of the portion in FIG. 4.

In one example, the perimeter of the antenna array 108 forms a hexagonal configuration (see FIG. 5). This permits the array to be divided into six triangular groups with equal amount of antennas each (see FIG. 6). The perimeter can also be configured in other shapes, e.g., square, pentagonal, heptagonal, or octagonal. These shapes can also be divided into groups that each cover a triangular section of the shape, e.g., four, five, seven, or eight groups.

Figure 2:
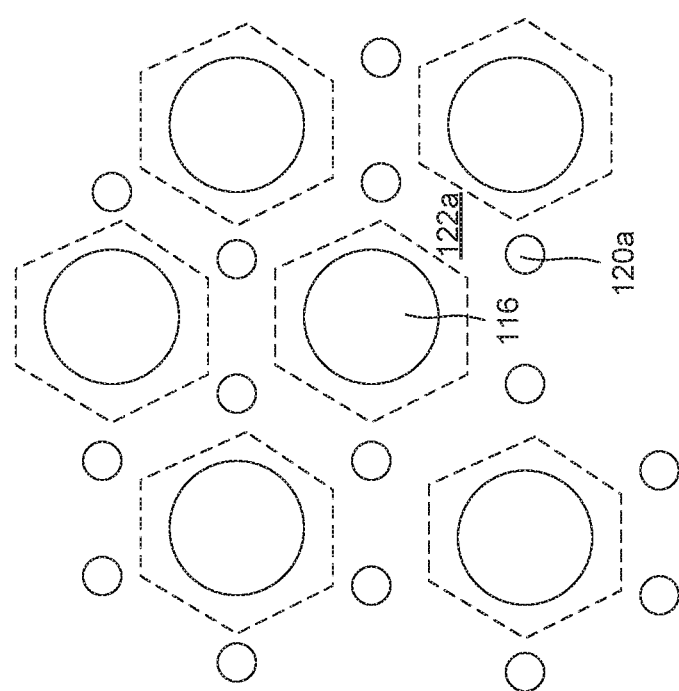
FIG. 2 is a schematic bottom view of a ceiling of the plasma reactor of FIG. 1.

The antennas can be disposed with substantially uniform spacing in the array 108. Within the array 108, the antennas can be disposed in a hexagonal or rectangular pattern (see FIG. 2). The pitch of the antennas in the array can be about ½ to 2 inches. The antennas 116 can have be uniformly sized and shaped in their cross-section, e.g., the antennas can have a circular cross-section. Alternatively, some of the antennas can have different cross-sectional sizes, e.g., antennas at the center can have a larger diameter. The length L of the portion 116c of the antenna 116 that projects into the chamber can be greater than the width W (see FIG. 4).

In some implementations, the antennas project through a showerhead 118, e.g., a dual channel showerhead (DCSH). The showerhead 118 can include a gas distribution plate 120 and a gas plenum plate 122. A long axis of the antennas 116 can be perpendicular to a lower face of the showerhead 118.

A workpiece support pedestal 106 for supporting a workpiece 124 in the lower chamber 100b has a workpiece support surface 106a. The workpiece support pedestal 106 can be moveable, e.g., by a linear actuator, along an axial direction, e.g., to adjust the height of the workpiece support pedestal in the chamber 100. The workpiece support surface 106a can face the grid filter 112. A long axis of the antennas 116 can be perpendicular to the support surface 106a of the support pedestal 106.

In some implementations, the pedestal 106 includes one or more heating elements 107 configured to apply heat to the workpiece 124. The heat from the heating elements 107 can be sufficient to anneal the workpiece 124 when the workpiece is supported on the pedestal 106 and the precursor gas (if used) has been introduced into the chamber 100b. The heating elements 107 may be resistive heating elements. With the heating elements 107 positioned, e.g., embedded in, the pedestal 106, the workpiece 124 is heated through contact with the pedestal. An example of a heating element 107 includes a discrete heating coil. Electrical wires connect an electrical source (not shown), such as a voltage source, to the heating element, and can connect the one or more heating elements 107 to a controller.

The pedestal 106 can be configured to hold the workpiece 124 such that a front surface of the workpiece 124a faces the grid filter 112; the front surface 124a can be parallel to the grid filter 112. In another example, as discussed in further detail below, the pedestal 106 can be configured so that the front surface of the workpiece 124a faces the antenna array.

In some implementations, the pedestal 106 can mechanically rotate about an axis of rotation that coincides with an axis of symmetry 106b of the pedestal. This rotation can improve the plasma uniformity of the process on the workpiece 124. The pedestal 106 can be rotated by a rotation motor (not shown) attached to the pedestal.

The AC power source 110 is connected to the monopole antennas 116. For example, the power source 110 can be coupled to the antennas array 108 via one or more coaxial cables. The power source 1100 can operate a frequency range of 30 Hz to 30 GHz. For example, the power source 110 can generate power at microwave frequencies, e.g., 300 MHz to 30 GHz, at RF frequencies, e.g., 300 kHz to 30 MHz, and/or at VHF frequencies, e.g., 30 MHz to 300 MHz. The power source 110 is configured or controlled to apply microwave or RF power to the plurality of monopole antennas so as to generate plasma in the chamber 100. In some implementations, the power source 110 can also apply a DC voltage.

As will be described further below, the AC power source 110 can be configured to generate AC power on a plurality of power supply lines at different phases, and supply power through those lines to different groups of the monopole antennas 116.

In some implementations, a conductive shield 134 that includes a cylindrical side wall 136 surrounds the upper sidewall 102a and extends over the ceiling 104 (e.g., over the showerhead 118). The conductive shield 134 can be electrically grounded.

In some implementations, an upper gas injector assembly provides process gas into the upper chamber 100a. In some implementations, the upper gas injector assembly can include a plurality of upper gas injectors 138, e.g., to provide gas from the ceiling 104 of the chamber 100. The gas injectors 138 allow uniform gas injection into the plasma chamber 100a.

For example, gas is supplied from a gas supply 126 through a gas conduit 130 to one or more gas distribution ports 128. The gas distribution port(s) 128 can be coupled to a gas plenum. For example, a recess 122a in the underside of the gas plenum plate 122 can provide the plenum for the flow of gas from the conduit 130. The gas plenum plate 122 overlies a gas distribution plate 120. The gas distribution plate 120 has a plurality of gas injection orifices 120a that extend through the gas distribution plate 120 and that are fluidically coupled to the gas plenum to distribute the gas into the upper chamber 100a. The orifices 120a and optionally a portion of the recess 122a can provide the upper gas injectors 138.

The gas injection orifices are positioned in spaces between the monopole antennas 116. For example, referring to FIG. 2, if the monopole antennas 116 are arranged in a hexagonal array, the gas injection orifices 120a can similarly be arranged in a hexagonal array, e.g., with each monopole antenna 116 surrounded by six orifices 120a. Similarly, the recess 122a in the bottom surface of the gas plenum plate 122 can be a honeycomb-shaped, with the antenna 116 extending through the non-recessed portion, i.e., the center of each cell of the honeycomb.

Figure 9:
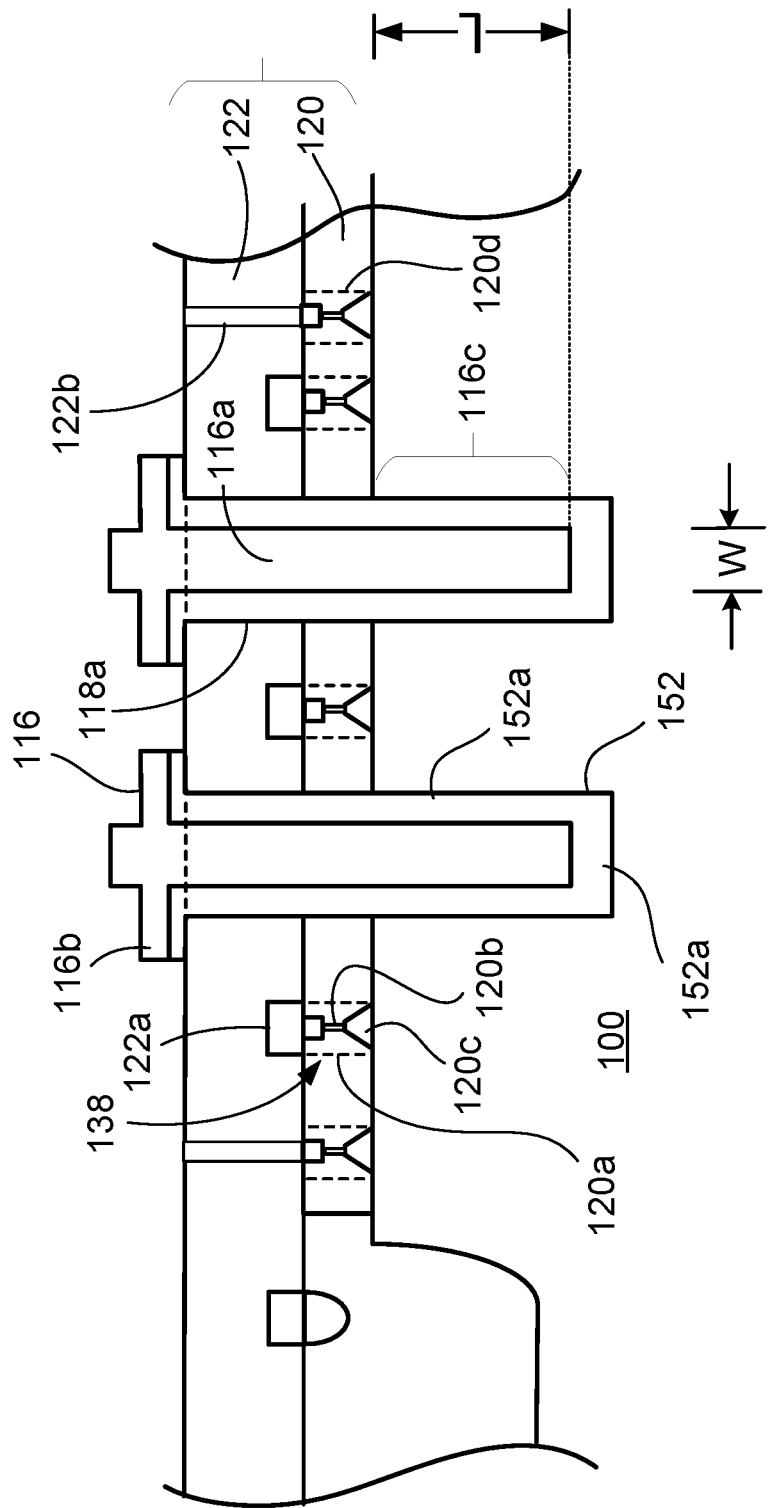
FIG. 9 is an example of a different embodiment of the portion in FIG. 4.

Although FIG. 1 illustrates the plenum as being formed by a recess in the bottom of a plenum plate, a volume 146 above the array 108 of monopole antennas 116 could provide a plenum for gas supply. In this case, for some implementations, the plenum plate 122 is omitted, and passages extend entirely through the showerhead 118 (which is effectively the gas distribution plate 120) to connect directly to the volume 146. This volume would be enclosed by the cover 134, and gas would be supplied by a port extending through the cover 134. Alternatively, referring to FIG. 9, the plenum plate 122 can serve as a second gas distribution plate that includes both the recess 122a for the plenum, and a plurality of passages 122*b* that couple to another plurality of gas injection orifices 120*d* in the first gas distribution plate 120. In this case, the volume 146 can provide a second process gas plenum overlying the second gas distribution plate 122, and a second process gas supply conduit can be coupled to the second process gas plenum. This permits two different process gases to be supplied to the chamber. The monopole antennas 116 extend through both the first gas distribution plate 120 and the second gas distribution plate 122.

Returning to FIG. 1, although a showerhead 118 in the ceiling of the chamber is illustrated, alternatively or in addition, gas could also be supplied through the side walls, e.g., through apertures in the upper sidewall 102*a*.

In some implementations, a lower gas injector assembly provides process gas into the lower chamber 100*b*. The lower gas injector assembly can include a plurality of lower gas injectors 158, e.g., to provide gas from the ceiling 104 of the chamber 100. The gas injectors 158 allow uniform gas injection into the plasma chamber 100*a*. The lower gas injectors can be placed as part of, instead of, or below the grid filter 112.

For example, the lower gas injector assembly could be similar to the upper gas injector assembly. In particular, the grid filter 112 can include a gas distribution plate 150 and a gas plenum plate 152. A recess 152*a* in the underside of the gas plenum plate 152 can provide the plenum for the flow of gas through a second distribution port 148 from the conduit 130. The gas distribution plate 150 has a plurality of gas injection orifices 150*a* that extend through the gas distribution plate 120 and that are fluidically coupled to the gas plenum to distribute the gas into the lower chamber 100*b*.

Again, although gas injection orifices 150*a* in the grid filter 112 are illustrated, alternatively or in addition, gas could also be supplied through the side walls, e.g., through apertures in the lower sidewall 102*b*.

In such implementations, gas species and gas flow rates into the upper and lower chambers 100*a*, 100*b* are independently controllable. In one example, an inert gas is supplied into the upper chamber 100*a* and a process gas is supplied into the lower chamber 100*b*. The inert gas flow rates can be controlled to substantially prevent convention or diffusion of gases from the lower 100*b* into the upper chamber 100*a*, providing substantial chemical isolation of the upper chamber 100*a*. The gas delivery system can include an exhaust system 140, e.g., including a vacuum pump, to exhaust the precursor gas from the upper chamber 100*a*, thereby depressurizing the chamber 100.

In some implementations, the AC power source 110 comprises a plurality of auto-tuners, each auto-tuner coupled to a different monopole antenna 116. The level of RF power from the RF generator 110 is highly controllable. This may allow the plasma density in the upper chamber 100*a* to be substantially controlled (enhanced) by the RF power from the RF power generator. As a result, the formation of lattice defects or voids in the deposited material can be reduced.

In some implementations, the grid filter 112 is a flat disk shape. The grid filter can extend across the chamber 100. The grid filter 112 is formed with an array of plural openings 112-1. The openings 112-1 can be uniformly spaced across the grid filter 112. The axial thickness T of the grid filter 112 and the diameter, d, of the plural openings 112-1 can be selected to promote flow through the grid filter 112 of energetic directed beam electrons while impeding flow of non-beam (low-energy) electrons and plasma ions through the grid filter 112.

The plasma in the lower chamber 100*b* may have different characteristics from the plasma in the upper chamber 100*a*.

The grid filter 112 may function as a filter to substantially electrically isolate the upper and lower chambers 100*a*, 100*b* from one another. In some implementations, the grid filter 112 is formed of a conductive or semi-conductive material. For example, the grid filter 112 can be a metal, such as aluminum. The grid filter 112 can be connected to ground or can be electrically floating. The grid filter 112 can be RF hot or grounded depending on whether the substrate is grounded or RF hot. In some implementations, the grid filter 112 is formed of a non-conductive material. In some implementations, the grid filter 112 is coated with a process compatible material such as silicon, carbon, silicon carbon compound or a silicon-oxide compound, or an oxide material, e.g., as aluminum oxide, yttrium oxide, or zirconium oxide.

Figure 3:
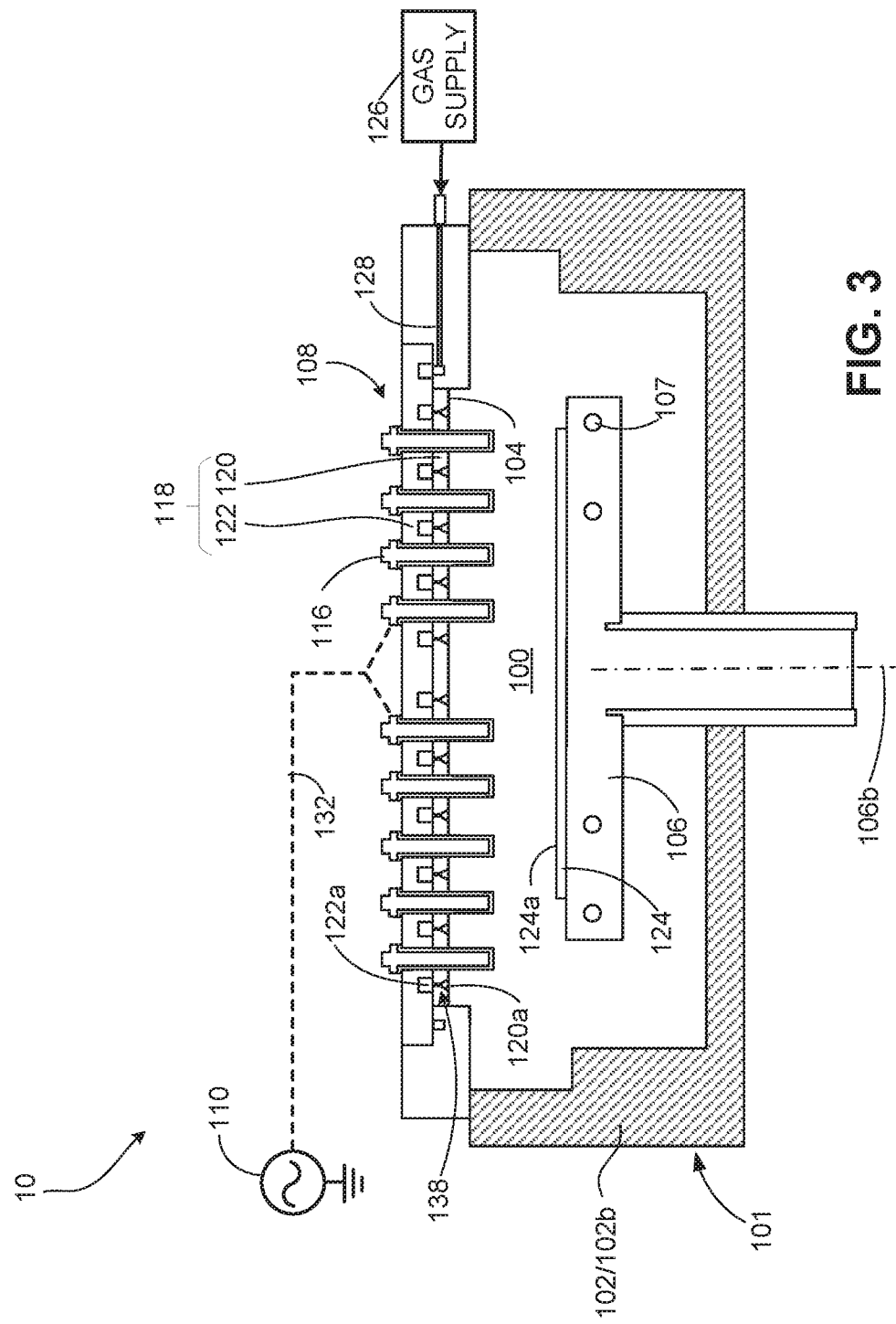
FIG. 3 is schematic cross-sectional side view of a plasma chamber in accordance with a second embodiment.

Referring now to FIG. 3, a single-chamber plasma reactor 10 includes a plasma chamber 100 containing the workpiece support 106. In general, except as described below, the reactor of FIG. 3 would be the same as the reactor of FIG. 1. For example, the plasma reactor can use the same array of monopole antennas.

Unlike the implementation illustrated in FIG. 1, the plasma reactor illustrated in FIG. 3 is not divided into an upper chamber and a lower chamber; there is no grid filter extending across the chamber. As such, the reactor has only the single chamber 100. So the array 108 of monopole antennas will generate the plasma in the same chamber as the workpiece support. The chamber 100 is enclosed by a sidewall 102 formed of a microwave opaque material, such as a metal. In some implementations, the sidewall 102 includes a transparent window or is a transparent material such as a dielectric material.

In this example, a gas injector assembly includes a plurality of gas injectors 138 distribute gas directly into the plasma chamber 100 where the workpiece 124 is located. Gas is supplied from a gas supply 126 through a gas conduit 130. One or more gas distribution ports 128 are coupled to a gas plenum provided by a recess 122*a* in an underside of the gas plenum plate 122. The gas plenum plate 122 overlies a gas distribution plate 120. The gas distribution plate 120 has a plurality of gas injection orifices 120*a* which extend through the gas distribution plate 120 and are fluidically coupled to the gas plenum. The orifices 120*a*, optionally with a portion of the recess 122*a*, can provide the gas injectors 138 that distribute the gas into the chamber 100. The gas injection orifices are positioned in spaces between monopole antennas 116.

The AC power source 110 provides the MW frequency needed to an array of monopole antennas 108. The monopole antennas 116 extend parallel into the plasma chamber 100. A potential advantage of this configuration is that it can provide a high density plasma to processes that require high energy such as DLC deposition, and can increase plasma efficiency and wafer temperature.

Figure 4:
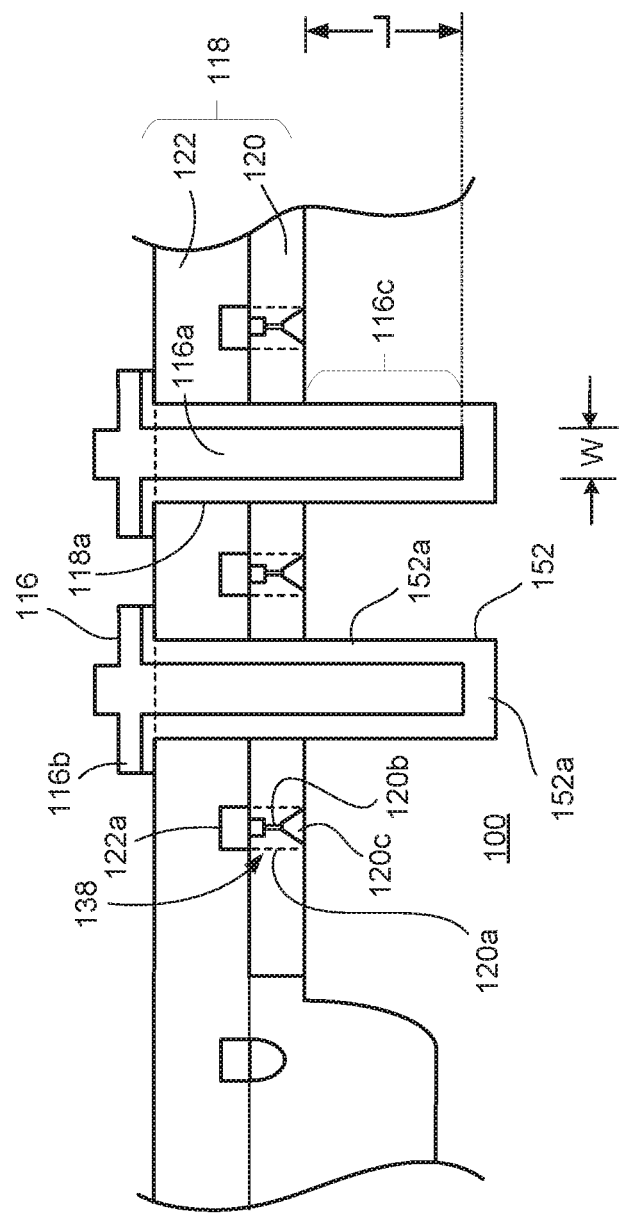
FIG. 4 is an enlarged view of a portion of FIG. 1.

Referring now to FIG. 4, the dual channel showerhead 118 includes the gas plenum 122 and gas distribution plate 120. In one example, the showerhead is made of, e.g., aluminum. In some implementations, the showerhead includes a disk shaped plate with perforations on a bottom surface that provide the orifices 120*a* for dispensing reactant gases uniformly over a second parallel planar surface, such as a grid filter or a workpiece. In some implementations, the orifices provide nozzles with a narrow passage 120*b* that leads from the plenum to a flared nozzle 120*c* at the bottom surface of the showerhead 118.

In addition, the showerhead 118 includes orifices 118*a* extending from a top surface to a bottom surface, each orifice sized to hold an individual monopole antenna 116.

The spacing between the orifices 118a can be selected to effectively maximize the number of antennas 116 in the showerhead 118 in consideration of the power and current. For example, the spacing between antennas 116 can be such that adjacent antennas 116 are close, e.g., less than 10 mm apart, but do not touch. The antennas 116 should not be so close that shorting may occur. For examples, the adjacent antennas 116 can be more than 2 mm apart.

As illustrated in FIG. 4, each monopole antenna 116 can have a cylindrical shaft 116a that projects into the chamber 100a. However, monopole antennas of different shapes and lengths may be suitable for different purposes and applications during the deposition or etch process. For example, as shown in FIG. 5, the portion 216a of the monopole antennas that projects into the chamber 100a can have a conical shape. Returning to FIG. 4, the antenna 116 can have an outwardly projecting flange or shoulder 116b. The flange or shoulder 116 can be a circular projection that extends laterally from the shaft 116a. The flange or shoulder 116 is positioned above the showerhead 118. The orifice 118a allows the shoulder 116b of the monopole antenna 116 to sit on the top surface of the showerhead 118 while allowing the shaft 116a to project beyond the showerhead 118 into the plasma chamber 100. This can fix the vertical position of the bottom of the antenna 116 within the chamber 100.

Monopole antennas 116 can reach elevated temperatures (e.g., 30° C. to 400° C.), due to the high voltages applied during the process. Temperature control can be provided by a channel (not shown) in a support for the antenna, e.g., a channel in the gas distribution plate 120. The channel carries coolant to absorb the excess heat from the antennas 116 and surrounding components. A heat exchanger positioned outside the chamber can be used to remove heat from the coolant.

Each monopole antenna 116 is partially surrounded by an insulator dielectric sheath 152. In particular, the sheath 152 can tightly cover at least the portion 116c of the antenna 116 that extends into the chamber 110. The sheath can also cover the entire shaft 116a, e.g., the whole portion that extends through the gas distributor 120 and gas plenum 122 as well as the portion that extends into chamber 100a. The sheath 152 is transparent to the radiation generated by the monopole, e.g., the sheath 152 can be a microwave or RF transparent window sheath.

The sheath 152 can include a cylindrical section 152a that surrounds the shaft 116a of the monopole antenna 116 and a floor 152b that covers the bottom of the monopole antenna 116. The sheath 152 can also include an outwardly projecting flange or shoulder 152c that extends from the top of the cylindrical section 152. This flange or shoulder 152 separates the flange 116b of the monopole antenna 116 from the top surface of the showerhead 118 16b. Conical monopole antennas 216 are surrounded by a conical window sheath 252 (see FIG. 5).

The window sheath 152 can be formed of an electrically insulating material such as ceramic, aluminum oxide, or quartz. The sheath 152 can electrically isolate the antennas 116 from the gas distribution plate 120 and gas plenum plate 122 and can protect the conductor from the environment in the chamber 100a. The sheath can also prevent contamination of the process, e.g., metal sputtering off the antenna 116.

Figure 6:
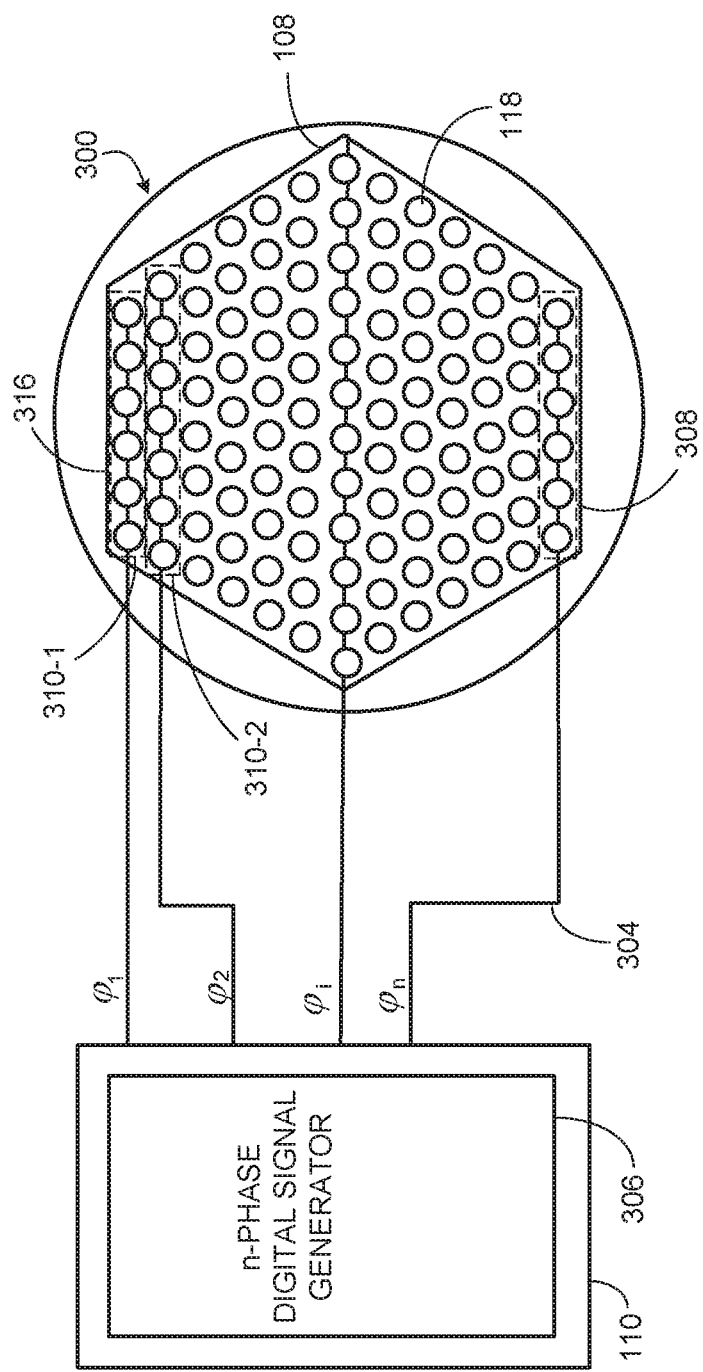
FIG. 6 is a schematic top view of an antenna array in accordance with a first embodiment.
Figure 7:
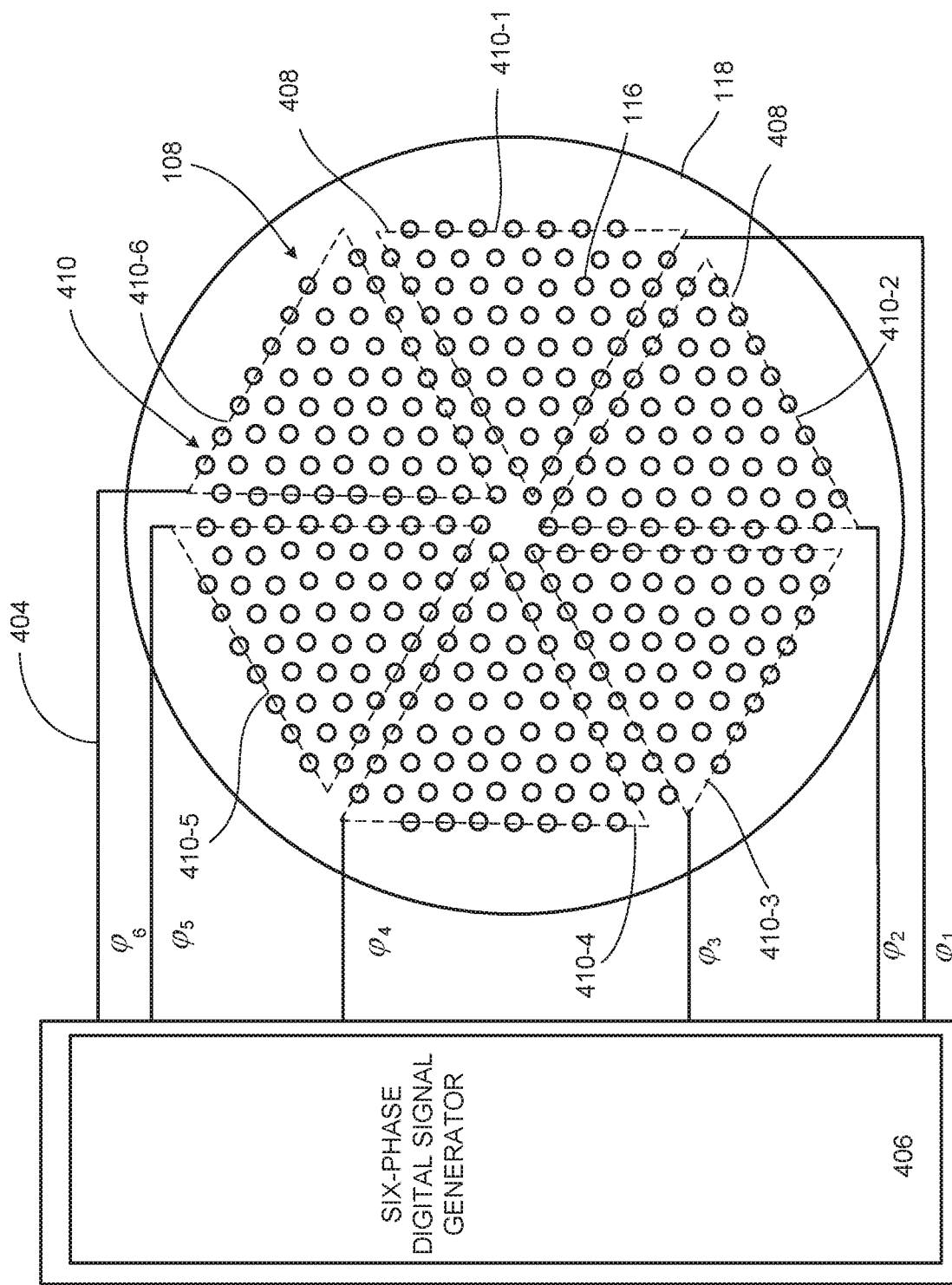
FIG. 7 is a schematic top view of an antenna array in accordance with a second embodiment.

Referring to FIGS. 6 and 7, as noted above, the AC power source 110 can be configured to supply power to different groups of monopole antennas 116 at multiple different relative phases. To provide the different groups, the monopole antennas 116 can be phase-controlled individually or in groups. The power source 110 can include a single signal source 306, the output of which is split and then subject to phase shifting, e.g., with analog circuitry. Alternatively, the power source 110 could include multiple power sources, e.g., multiple digital signal generators 306, that generate the multiple signals at the different phases.

In general, where the array 108 is divided into N groups, the AC power supply can generate power at N different phases, e.g., N phases separated by 360/N degrees. The AC power supply can be configured to generate AC power on a number of supply lines N at phases separated by 360/N. The antennas 116 can be separated into a different amount of groups 308/408 such as 4, 5 or more groups. Each group of antennas can occupy a spatially contiguous zone of the antenna array.

FIG. 5 illustrates an example of an array having groups that are arranged as linear rows. In particular, FIG. 5 illustrates an example of a linear phased array. The array can split into N groups 308. The groups can be provided by different rows 308 of antennas 116, e.g., each zone can cover a generally linear stripe across the array. An N-number of conductor lines 304 can be used to connect the power supply 110 to the N groups of antennas 116, providing a different phase to each group of antennas. FIG. 5 illustrates the monopole antenna array 108 arranged in a hexagonal configuration, but this is not required.

FIG. 6 illustrates an example of an array having groups that are angularly spaced around a central axis. For example, each zone can cover a circular sector; if the N zones are of equal sizes then the arc would be 360/N degrees. In the illustrated example, the antennas 116 are divided into six different groups 408. Each group 408 is coupled to a different conductor line 404, thus providing a different phase to each group of antennas. The groups can be triangular zones of equal area on the array.

Zones that are spatially adjacent to one another can be provided power at sequentially adjacent phases from the multiple different phases. For example, in FIG. 6, there are six zones 410, and the signal applied to two adjacent zones, e.g., zones 410-1 and 410-2, are separated by 60°. For example, power can be applied to the zones 410-1, 410-2, 410-3, 410-4, 410-5 and 410-6 at relative phases of 0°, 60°, 120°, 180°, 240°, and 300°.

As another example, in FIG. 5, there are N zones 310, and the signal applied to two adjacent zones 310-1 and 310-2 are separated by N/360°. For example, power can be applied to the zones 310-1, 310-2, . . . 310-N at relative phases of 0°, (1/N)*360°, . . . (N-1/N)*360°. Although in these examples the phases are separated by equal intervals, this is not required.

A polar phased array or a linear phased array to control the monopole antennas 116 can be used with different configurations. For example, a polar phased array can use a six-phased power control configuration through a digital signal generator 406 in order to send a different signal to the groups of antennas 116 in increments of 60, as shown in FIG. 6. This increases the uniformity of the plasma similarly than having a rotary antenna. In another example, as shown in FIG. 5, a linear phased array can be used in a n-phased power control configuration using a digital signal generator 306. This allows for great controllability of antennas frequency and thus a more uniform plasma.

Phase shifting the power applied to different groups of antennas can increases uniformity of the plasma deposition. In effect, this method mimics a mechanically rotating rotary antenna during a plasma deposition process, albeit at extremely high rotation rates. The phase shifting frequency, i.e., the frequency at which a given zone returns to the same phase offset, can be set between 1-1000 Hz.

Figure 8:
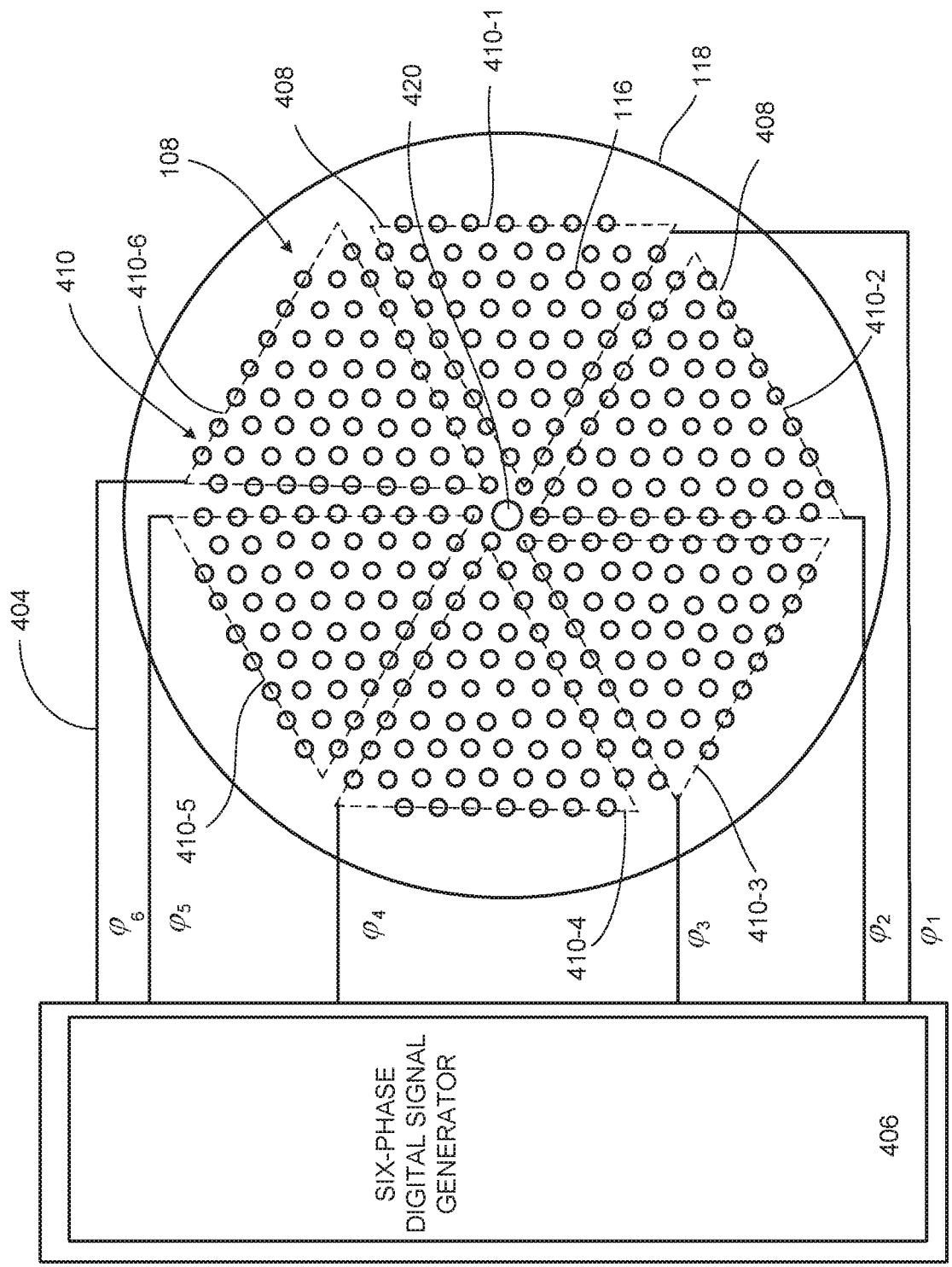
FIG. 8 is a schematic top view of an antenna array in accordance with a third embodiment.

The implementation of FIG. 8 is similar to the implementation of FIG. 7, but includes an additional center antenna 420 positioned at the center of the array 108 of monopole antennas 116. The center antenna 420 can be larger (e.g., greater diameter in the plane parallel to the array 108 and support surface 106a) than the other antennae 116. The center antenna 420 can be driven with a one-phased signal, e.g., generated by a digital signal generator. An advantage of the center antenna 116 is to provide power adjustment for the center-to-edge uniformity tuning in the process.

Alternatively or in addition to the phase shifting discussed above, power can be applied to the antennas in pulses. For example, power can be applied in pulses at rate of 1-1000 Hz. The pulses can have a duty cycle of 5 to 95%, e.g., 25-75%. Within the given on-time of the duty cycle, power can be applied at RF or microwave frequencies, e.g., 300 kHz to 30 GHz.

In some implementations, the plasma reactor can be used for the deposition of a film in a PECVD process. In such a process, the layer being deposited can have some empty atomic lattice sites. As additional layers are deposited, the additional layers cover the empty lattice sites, thus forming voids in the crystalline structure of the deposited material. Such voids are lattice defects and impair the quality of the deposited material. A microwave source such as that employed in the embodiment of FIG. 1, generates a plasma with very low ion energy, so that it does not disturb the lattice structure of the deposited material, including the lattice defects. Such a microwave source may have a frequency of 2.45 GHz, which generates a plasma having a negligible ion energy level.

In general, the frequency of a microwave is not so accurate, and has a fluctuation of approximately ±2%. Because the frequency of a microwave has fluctuation, the reflectance of a microwave path changes significantly, resulting in a change in the electric power of the microwave supplied to the antennas and a change in plasma density. In order to control the plasma density according to the electric power of a reflected wave, thus, it is necessary to accurately monitor the frequency of a microwave, so as to compensate for the change in the electric power of the reflected wave resulting from frequency fluctuation.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

A number of implementations have been described. Nevertheless, it will be understood that various modifications may be made.

Accordingly, other implementations are within the scope of the claims.

What is claimed is:

1. A plasma reactor comprising:
    a chamber body having a floor, side walls and a ceiling defining an interior space that provides a plasma chamber;
    a process gas distribution system on the ceiling of the chamber to deliver a processing gas to the plasma chamber, the process gas distribution system including a conductive first gas distribution plate having a first plurality of gas injection orifices and a plurality of apertures, a first plate overlying the gas distribution plate and defining a first process gas plenum there between, and a first process gas supply conduit coupled to the first process gas plenum;
    a work piece support to hold a work piece; and
    an antenna array comprising a plurality of monopole antennas, each monopole antenna comprising an elongated rod extending from above a top of the conductive first gas distribution plate perpendicular to the conductive first gas distribution plate toward the work piece support through a respective aperture of the plurality of apertures in the conductive first gas distribution plate and past a portion of the conductive first gas distribution plate bounding the respective aperture through which the monopole antenna extends and partially into the plasma chamber, wherein each monopole antenna of the plurality of monopole antennas is surrounded by an insulative sheath that extends from the conductive first gas distribution plate to a tip of the monopole antenna to cover an end portion including the tip of the monopole antenna, and wherein each monopole antenna comprises a tapered end portion extending into the plasma chamber.

2. The plasma reactor of claim 1, wherein the first plurality of gas injection orifices are positioned in portions of the first gas distribution plate that separate the monopole antennas.

3. The plasma reactor of claim 1, wherein the first plate serves as a gas plenum plate and contacts the first gas distribution plate and has a recess on a surface thereof that faces the first gas distribution plate, the recess providing the first process gas plenum.

4. The plasma reactor of claim 3, wherein the recess includes a plurality of recesses and the plurality of monopole antennas extend through non recessed regions of the gas plenum plate between the recesses.

5. The plasma reactor of claim 3, wherein each monopole antenna is surrounded by a respective portion of the recess.

6. The plasma reactor of claim 3, wherein the first plate further serves as a second gas distribution plate and has a plurality of passages there through that couple to a second plurality of gas injection orifices in the first gas distribution plate, the plasma reactor further comprising a second plate overlying the first plate and providing a second process gas plenum there between.

7. The plasma reactor of claim 6, wherein the plurality of monopole antennas extend through the first gas distribution plate and the second gas distribution plate.

8. The plasma reactor of claim 1, wherein the plurality of monopole antennas are arranged in a hexagonal pattern.

9. The plasma reactor of claim 8, wherein the first plurality of gas injection orifices are arranged in a hexagonal pattern.

10. The plasma reactor of claim 1, comprising an AC power source configured to apply microwave or RF power to the plurality of monopole antennas so as to generate plasma in the plasma chamber.

11. The plasma reactor of claim 1, wherein the plurality of monopole antennas extend in parallel into the plasma chamber.

\* \* \* \* \*